United States Patent
Anezaki et al.

(10) Patent No.: US 7,936,579 B2
(45) Date of Patent: *May 3, 2011

(54) SEMICONDUCTOR MEMORY DEVICE AND SEMICONDUCTOR DEVICE GROUP

(75) Inventors: Toru Anezaki, Kawasaki (JP); Tomohiko Tsutsumi, Kawasaki (JP); Tatsuji Araya, Kawasaki (JP); Hideyuki Kojima, Kawasaki (JP); Taiji Ema, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/792,115

(22) Filed: Jun. 2, 2010

(65) Prior Publication Data

US 2010/0238716 A1   Sep. 23, 2010

Related U.S. Application Data

(60) Continuation of application No. 12/320,861, filed on Feb. 6, 2009, now Pat. No. 7,755,928, which is a continuation of application No. 11/802,812, filed on May 25, 2007, now Pat. No. 7,508,692, which is a division of application No. 10/988,530, filed on Nov. 16, 2004, now Pat. No. 7,269,053.

(30) Foreign Application Priority Data

Jul. 23, 2004 (JP) .................. 2004-216090

(51) Int. Cl.
*G11C 5/06* (2006.01)
(52) U.S. Cl. .................. 365/63; 365/154; 257/903
(58) Field of Classification Search .......... 365/63, 365/154, 156; 257/903
See application file for complete search history.

(56) References Cited

U.S. PATENT DOCUMENTS 5,040,146 A   8/1991   Mattausch et al.
6,108,262 A   8/2000   Itoh et al.
(Continued)

FOREIGN PATENT DOCUMENTS

DE   19731956 A1   8/1998
(Continued)

OTHER PUBLICATIONS

European Search Report dated Feb. 27, 2006, issued in corresponding European Patent Application No. 04027491.2.

(Continued)

*Primary Examiner* — Huan Hoang
(74) *Attorney, Agent, or Firm* — Westerman, Hattori, Daniels & Adrian, LLP

(57) ABSTRACT

A semiconductor device includes a first CMOS inverter, a second CMOS inverter, a first transfer transistor and a second transfer transistor wherein the first and second transfer transistors are formed respectively in first and second device regions defined on a semiconductor device by a device isolation region so as to extend in parallel with each other, the first transfer transistor contacting with a first bit line at a first bit contact region on the first device region, the second transfer transistor contacting with a second bit line at a second bit contact region on the second device region, wherein the first bit contact region is formed in the first device region such that a center of said the bit contact region is offset toward the second device region, and wherein the second bit contact region is formed in the second device region such that a center of the second bit contact region is offset toward the first device region.

11 Claims, 17 Drawing Sheets

U.S. PATENT DOCUMENTS

| | | |
|---|---|---|
| 6,229,186 B1 | 5/2001 | Ishida |
| 6,495,899 B2 | 12/2002 | Natsume |
| 6,559,510 B1 | 5/2003 | Yokoyama |
| 6,697,278 B2 | 2/2004 | Nagamine et al. |
| 6,891,742 B2 | 5/2005 | Takano et al. |
| 7,087,493 B1 | 8/2006 | Madan |
| 7,269,053 B2 * | 9/2007 | Anezaki et al. ............... 365/154 |
| 7,755,928 B2 * | 7/2010 | Anezaki et al. ............... 365/154 |
| 2002/0024105 A1 | 2/2002 | Ishida |
| 2003/0067813 A1 | 4/2003 | Nagamine et al. |

FOREIGN PATENT DOCUMENTS

| | | | |
|---|---|---|---|
| JP | 5-225786 A | 9/1993 | |
| JP | 7-22590 A | 1/1995 | |
| JP | 2001-144192 A | 5/2001 | |
| JP | 2001-284470 A | 10/2001 | |
| JP | 2001-358234 A | 12/2001 | |
| JP | 2003-115550 A | 4/2003 | |
| KR | 2001-0051580 A | 6/2001 | |
| KR | 2001-0095151 A | 11/2001 | |

OTHER PUBLICATIONS

Korean Office Action dated Jun. 26, 2006, issued in corresponding Korean Patent Application No. 10 2004 0099354.

Japanese Office Action dated Jun. 17, 2008, issued in corresponding Japanese Patent Application No. 2004-216090.

* cited by examiner

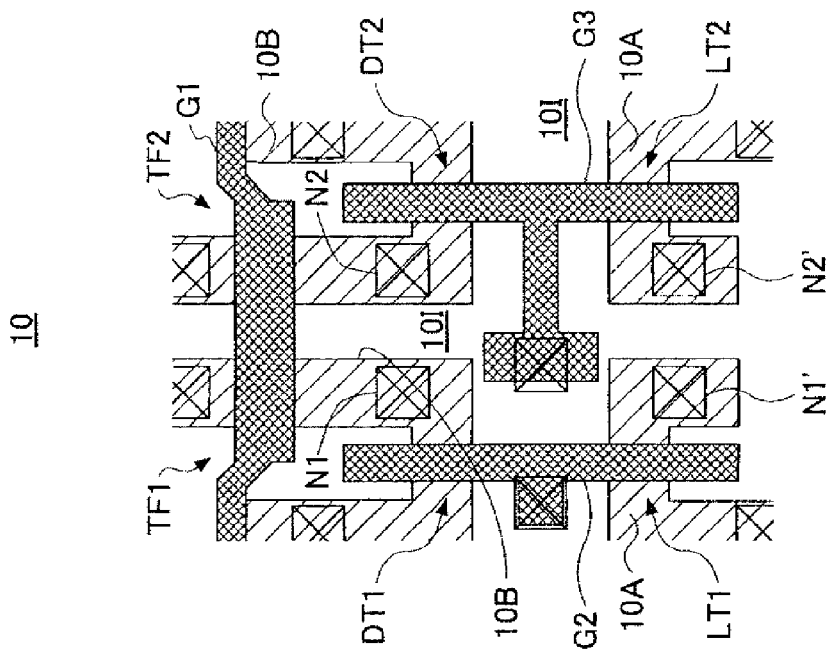
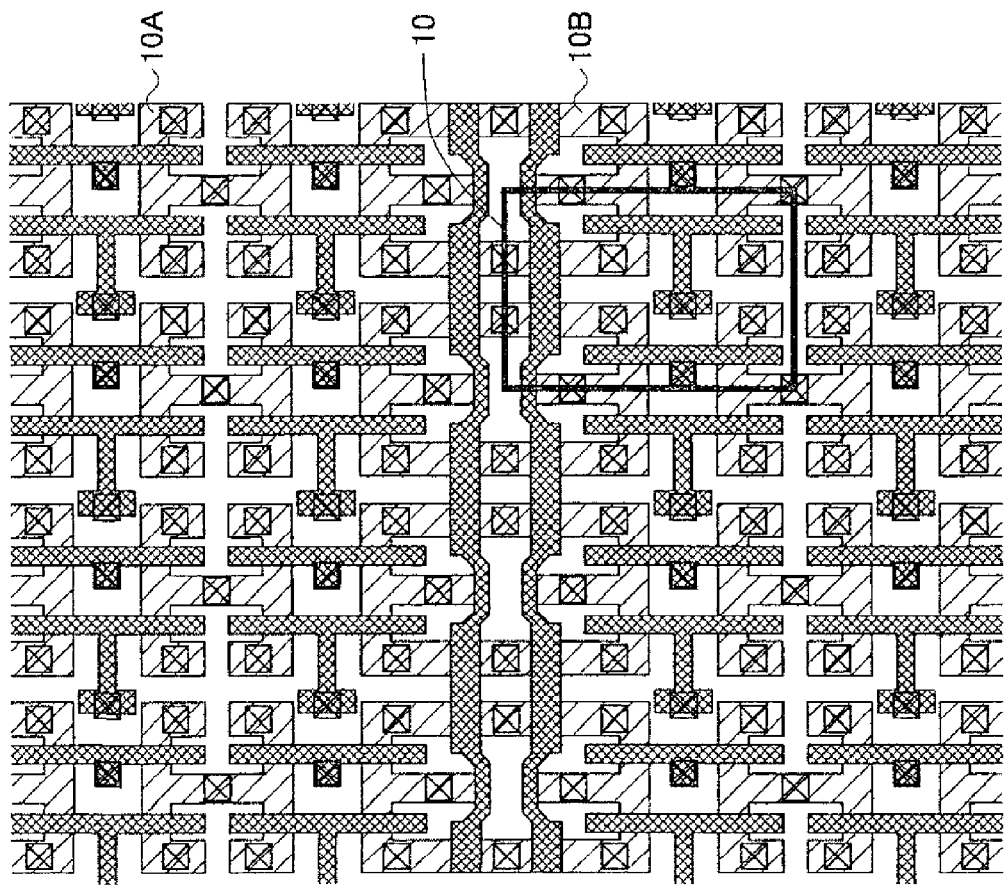

US 7,936,579 B2

SEMICONDUCTOR MEMORY DEVICE AND SEMICONDUCTOR DEVICE GROUP

CROSS-REFERENCE TO RELATED APPLICATION

This application is a continuation of U.S. application Ser. No. 12/320,861 filed on Feb. 6, 2009, issued as U.S. Pat. No. 7,755,928 on Jul. 13, 2010, which is a continuation of U.S. application Ser. No. 11/802,812 filed on May 25, 2007, issued as U.S. Pat. No. 7,508,692 on Mar. 24, 2009, which is a divisional of U.S. application Ser. No. 10/988,530 filed on Nov. 16, 2004, issued as U.S. Pat. No. 7,269,053 on Sep. 11, 2007, which is based upon and claims the benefit of priority from the prior Japanese Application No. 2004-216090 filed on Jul. 23, 2004, the entire contents of which are hereby incorporated by reference.

BACKGROUND OF THE INVENTION

The present invention generally relates to semiconductor devices and more particularly to a semiconductor memory device including a static random access memory.

A static random access memory (referred to hereinafter as SRAM) is a high speed semiconductor memory device comprising a transfer transistor selected by a word line and a pair of CMOS inverters forming a flip-flop connection and connected to a bit line via such a transfer transistor. SRAMs are used extensively in high-speed logic circuits together with a high-speed logic device such as a CMOS circuit.

FIG. 1 shows an equivalent circuit diagram of a typical SRAM 10.

Referring to FIG. 1, the SRAM 10 includes a flip flop circuit FF including therein a first CMOS inverter I1, in which a first load transistor LT1 and a first driver transistor DT1 are connected in series, and a second CMOS inverter I2, in which a second load transistor LT2 and a second driver transistor LD2 are connected in series, wherein it will be noted that a connection node N1 connecting the first load transistor LT1 and the first driver transistor DT1 with each other is connected to a first bit line BL via a first transfer transistor TF1 controlled by a word line WL. Similarly, a connection node N2 connecting the second load transistor LT2 and the second driver transistor LT2 is connected to a second bit line/BL via a second transfer transistor TF2 controlled by the word line WL.

In the SRAM of such a structure, the current drivability of the load transistors LT1 and LT2 driving the driver transistors DT1 and DT2 provides a profound effect on the high-speed operation of the SRAM.

FIG. 2A shows a layout of such an SRAM 10, while FIG. 2B shows the layout of one memory cell corresponding to the SRAM 10 of FIG. 1.

Referring to FIG. 2A, there are formed device regions 10A and device regions 10B on a surface of a silicon substrate in a row and column formation in the state surrounded by a device isolation structure 10I, wherein the memory cell having the circuit construction shown in FIG. 1 is formed by a part of the device region 10A and a part of the device region 10B as shown in FIG. 2B.

Referring to FIG. 2B, it will be noted that the transfer transistors TF1 and TF2 share a gate electrode G1, while the load transistor LT1 and the driver transistor DT1 share a gate electrode G2. Further, the load transistor LT2 and the driver transistor DT2 share a gate electrode G3.

The node N1 of FIG. 1 is provided by a diffusion region shared by the transfer transistor TF1 and the driver transistor DT1, wherein the diffusion region N1 is connected to a corresponding diffusion region N1' of the load transistor LT1 by way of an interconnection pattern not illustrated. Similarly, the node N2 of FIG. 1 is provided by a diffusion region shared by the transfer transistor TF2 and the driver transistor DT2, wherein the diffusion region N2 is connected to a corresponding diffusion region N2' of the load transistor LT2 via an interconnection pattern not illustrated.

Further, the gate electrode G2 is connected to the node N2 by way of an interconnection pattern not illustrated, and the gate electrode G2 is connected to the node N1 via an interconnection pattern not illustrated.

(Patent Reference 1) Japanese Laid-Open Patent Application 7-22590 official gazette
(Patent Reference 2) Japanese Patent 3,208,591

SUMMARY OF THE INVENTION

Meanwhile, with recent high-speed semiconductor integrated circuit devices, there arises a demand, in relation to the so-called SoC (silicon-on-chip) technology, of integrating DRAMs (dynamic random access memories) or flash memories with a high-speed logic device having such SRAMs for achieving further expansion of functions or further enhancement of performance.

On the other hand, in the case an attempt is made to integrate a flash memory with a high-speed logic device on a common semiconductor substrate, there arise various problems, associated with the fact that a flash memory device requires a high operational voltage, in any of the cases in which the flash memory is an NOR device that achieves writing of information by channel hot electrons (CHE) and erasing by Fowler-Nordheim (FN) tunneling current or in the case the flash memory is a NAND device in which both writing and erasing are achieved by FN tunneling current.

In a first aspect of the present invention, there is provided a semiconductor device, comprising:

a first CMOS inverter including a first re-channel MOS transistor and a first p-channel MOS transistor connected in series at a first node;

a second CMOS inverter including a second n-channel MOS transistor and a second p-channel MOS transistor connected in series at a second node, said second CMOS inverter forming a flip-flop circuit together with said first CMOS inverter;

a first transfer transistor provided between a first bit line and said first node, said first transfer transistor having a first gate electrode connected to a word line, said first transfer transistor being activated by a selection signal on said word line; and a second transfer transistor provided between a second bit line and said second node, said second transfer transistor having a second gate electrode connected to said word line, said second transfer transistor being activated by a selection signal on said word line, said first transfer transistor and said second transfer transistor being formed respectively in first and second device regions defined on a semiconductor device by a device isolation region so as to extend in parallel with each other, said first transfer transistor contacting with said first bit line at a first bit contact region on said first device region, said second transfer transistor contacting with said second bit line at a second bit contact region on said second device region, wherein said first bit contact region is formed in said first device region such that a center of said first bit contact region is offset toward said second device region, and wherein said second bit contact region is formed in said second device region such that a center of said second bit contact region is offset toward said first device region.

According to a second aspect of the present invention, there is provided a semiconductor device, comprising:

a first CMOS inverter including a first re-channel MOS transistor and a first p-channel MOS transistor connected in series at a first node;

a second CMOS inverter formed of a second re-channel MOS transistor and a second p-channel MOS transistor connected with each other at a second node, said second CMOS inverter forming a flip-flop circuit together with said first CMOS inverter;

a first transfer transistor provided between a first bit line and said first node, said first transfer transistor having a first gate electrode connected to a word line, said first transfer transistor being activated by a selection signal on said word line; and a second transfer transistor provided between a second bit line and said second node, said second transfer transistor having a second gate electrode connected to said word line, said second transfer transistor being activated by a selection signal on said word line, said first transfer transistor and said second transfer transistor being formed respectively in first and second device regions defined on a semiconductor substrate by a device insulation region so as to extend parallel with each other, said first transfer transistor contacting with said first bit line at a first bit contact region on said first device region, said second transfer transistor contacting with said second bit line at a second bit contact region on said second device region, wherein said first bit contact region is formed in said first device region such that a center of said first bit contact region is offset toward said second device region, and wherein said second bit contact region is formed such that a center of said second bit contact region is offset toward said first device region, said first transfer transistor having said first contact region on said first device region at a first side with respect to said first gate electrode and a first contact region forming said first node on said device region at an opposite side with respect to said gate electrode, said second transfer having said second bit contact region on said second device region at a first side with respect to said second gate electrode and a second contact region forming said second node on said second device region at an opposite side with respect to said second gate electrode, said first device region having a first width in a part in which said first bit contact region is formed, said first width being larger than a width of a part of said first device region in which said first contact region is formed, said second device region having a second width in a part in which said second bit contact is formed, said second width being larger than a width of a part of said second device region in which said second contact region is formed.

In another aspect of the present invention, there is provided a semiconductor device group comprising a first semiconductor device in which a non-volatile memory device, a logic device and a static random access memory device are integrated on a substrate, and a second semiconductor device in which a logic device and a static random access memory device are integrated on another substrate, wherein a first transfer transistor constituting said static random access memory device of said first semiconductor device has a channel width larger than a channel width of a second transfer transistor forming said static random access memory of said second semiconductor device, and wherein said first and second transfer transistors have an identical bit line pitch in respective channel width directions.

According to the present invention, it becomes possible to increase the ON current, in a semiconductor memory device such as so-called SRAM in which two CMOS inverters form a flip-flop connection, without changing a cell size of the transistors constituting the SRAM, by expanding the device regions of the respective transfer transistors in mutually opposite directions. Thereby, it becomes possible to compensate for the decrease of the ON current of the transfer transistor, which is caused in an SRAM in the case a non-volatile memory such as a flash memory is formed on the same substrate. With this, it becomes possible to guarantee a sufficient operational voltage margin even in the SRAMs integrated with a flash memory.

Further, according to the present invention, such a compensation of the ON current is achieved without changing the bit line pitch of the transistors constituting the SRAM including the transfer transistor. Thereby, it becomes possible to design a semiconductor device including a logic device, an SRAM and further a non-volatile memory on a substrate and also a semiconductor device that includes only a logic device and an SRAM but not a non-volatile semiconductor device on a substrate, by using the same library. Thereby, production of semiconductor devices of different kinds is facilitated.

Other objects and further features of the present invention will become apparent from the following detailed description when read in conjunction with the attached drawings.

BRIEF DESCRIPTION OF THE DRAWINGS

FIGS. 2A and 2B are diagrams showing a layout corresponding to the SRAM of FIG. 1;

DETAILED DESCRIPTION OF THE PREFERRED EMBODIMENT

Figure 3:
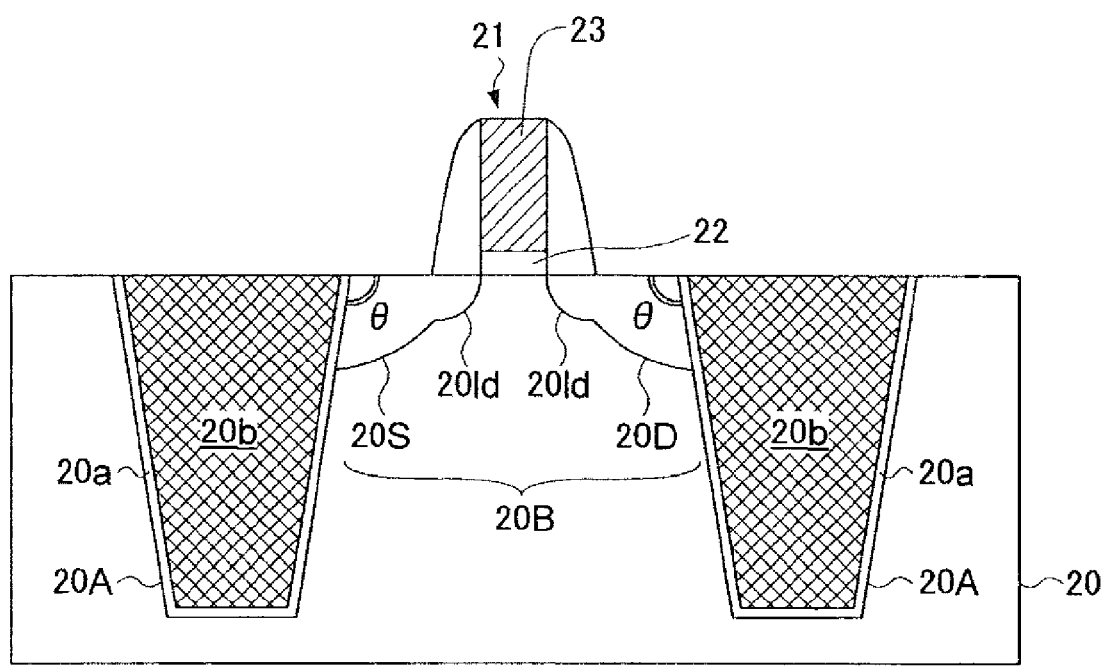
FIG. 3 is a diagram explaining an STI device isolation structure.

In the high-speed semiconductor integrated circuit of these days, so-called STI device isolation structure shown in FIG. 3 is used for electrically isolating individual active devices constituting the integrated circuit.

Referring to FIG. 3, there is formed a devise isolation trench 20A on a silicon substrate 20 so as to surround a device region 20B, and an active device 21 is formed in the device isolation region 20B such that the active device 21 includes a gate insulation film 22 and a gate electrode 23 formed in correspondence to a channel region thereof. Further, in the device region 20B, there are formed LDD regions 201d and 201d at both lateral sides of the gate electrode 23, and source and drain diffusion regions 20S and 20D are formed at outer parts of the LDD regions 201d and 201d in the device region 20B.

On the surface of the device isolation trench 20A, there is formed a thin thermal oxide film 20a typically having a thickness of about 10 nm, Further, on the thermal oxide film 20a, there is formed a CVD oxide film 20b so as to fill the device isolation trench 20A as a device isolation insulation film.

Because a flash memory uses high voltage of about 10V at the time of writing or erasing, contrary to the recent high-speed semiconductor integrated circuits, which operate at the voltage of about 2.5-3.3V, there is caused a concentration of electric field in the STI structure between the device region 20B and the device isolation trench 20A particularly at the corner part thereof, when an STI structure optimized for such a low supply voltage is used. Thereby, there is caused a problem of degradation of withstand voltage or degradation of reliability of the gate insulation film.

In view of this problem, it has been practiced to apply a processing, in conventional flash memory devices, to form the device region of the flash memory to be larger than that of a high-speed logic device and apply a process of rounding the corner part by a processing shows in FIGS. 4A-4E, such that the concentration of electric field at such a corner part is relaxed.

Figure 4A:
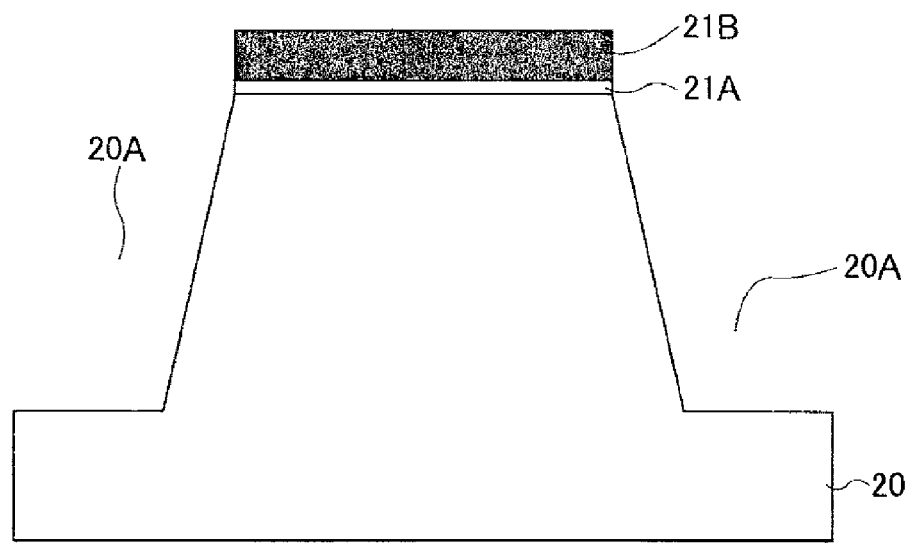
FIGS. 4A-4E are diagrams showing the process of forming an STI device isolation structure and a device structure in a flash memory.

Referring to FIG. 4A, a thermal oxide film 21A is formed on a silicon substrate 21 with a thickness of about 10 nm, and an SiN film 21B is formed thereon by a low-pressure CVD process with the thickness of about 120 nm. In the state of FIG. 3A, the SiN film 21B is patterned by a photolithographic process, and the device isolation trench 21A is formed by applying a dry etching process to the silicon substrate 20 with the thickness of about 300 nm while using the SiN pattern 21B thus formed as a mask.

Figure 4B:
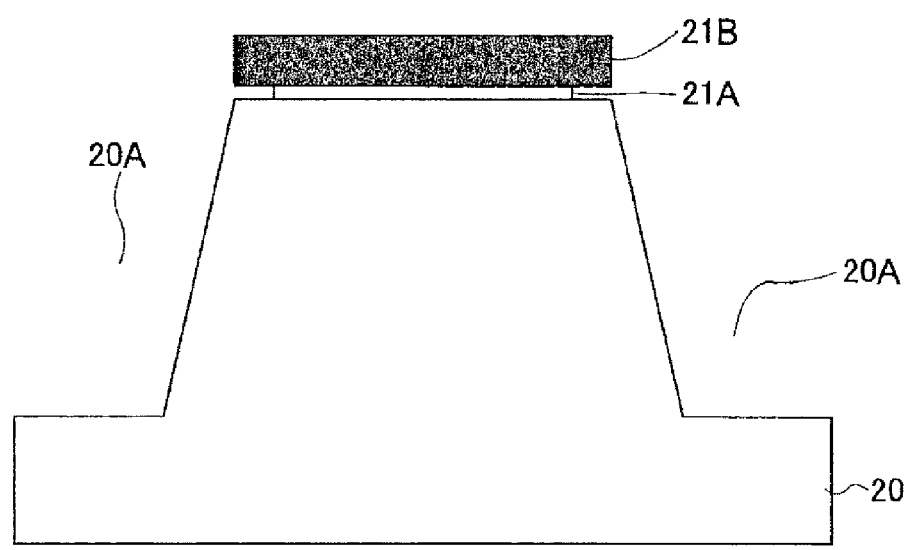

Next, in the step of FIG. 4B, the silicon oxide film 21A of FIG. 3A is removed by a wet etching process by using an HF aqueous solution while using the SiN pattern 21B as a mask, and as a result, there is formed a recess between the surface of the silicon substrate 20 and the SiN film 21B with a depth of 40 nm.

Figure 4C:
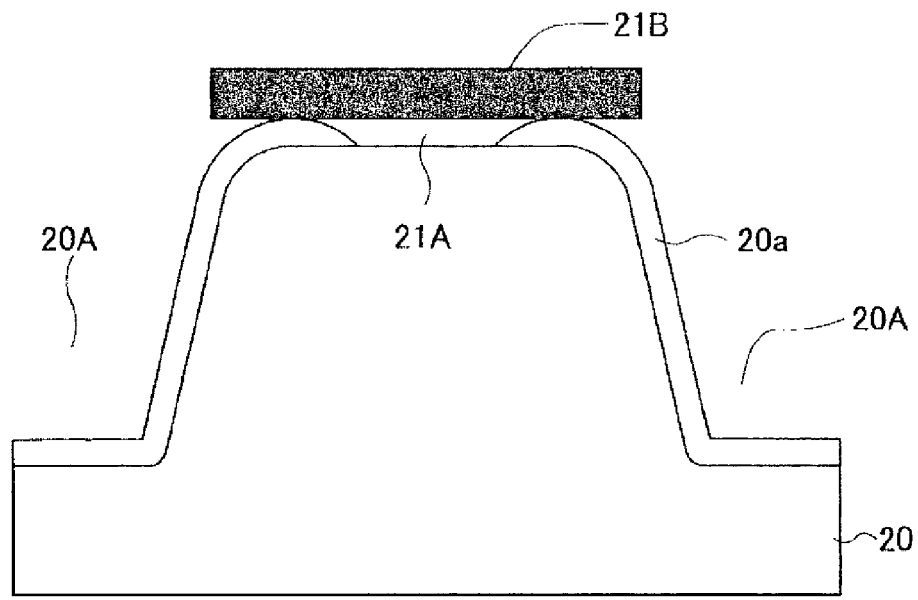

Next, in the step of FIG. 4C, the structure of FIG. 2B is subjected to a thermal oxidation processing, and the foregoing thermal oxide film 20a is formed on the exposed silicon surface with a thickness of about 40 nm, such that the thermal oxide film 20a fills the foregoing recess.

Figure 4D:
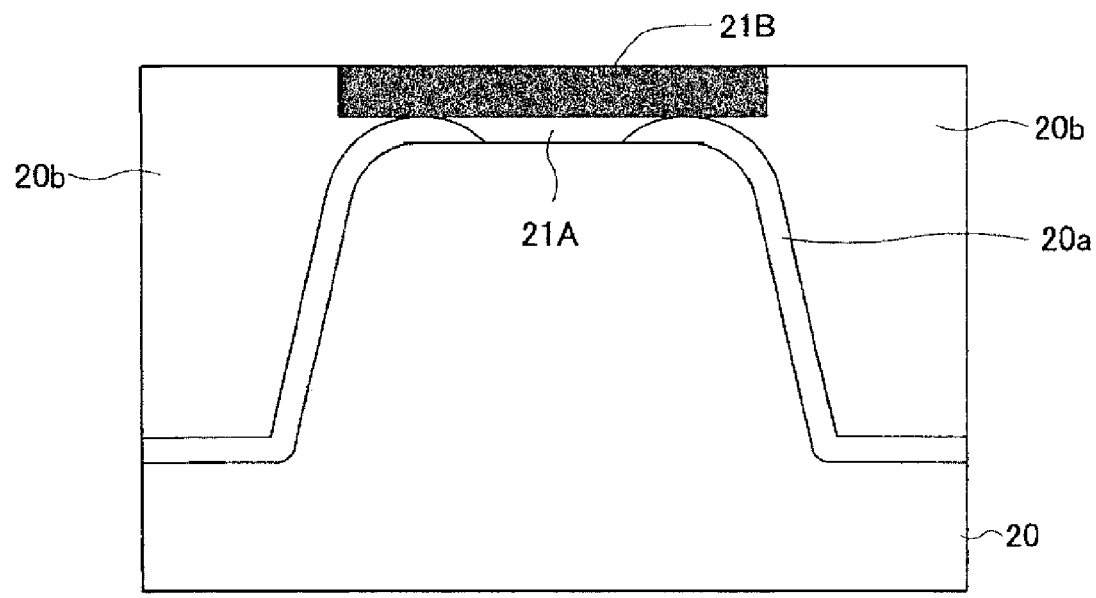

Next, in the step of FIG. 4D, a silicon oxide film 20b is deposited on the structure of FIG. 4C by a CVD process that uses high-density plasma, such that the silicon oxide film 20b fills the device isolation trench 20A, followed by a planarization processing of the silicon oxide film surface by a CMP process while using the SiN film 21B as a stopper. With this, a structure shown in FIG. 4D, in which the device isolation trench 20A is filled with the silicon oxide film and hence the device isolation insulation film 20b, via the thermal oxide film 20a, is obtained.

Figure 4E:
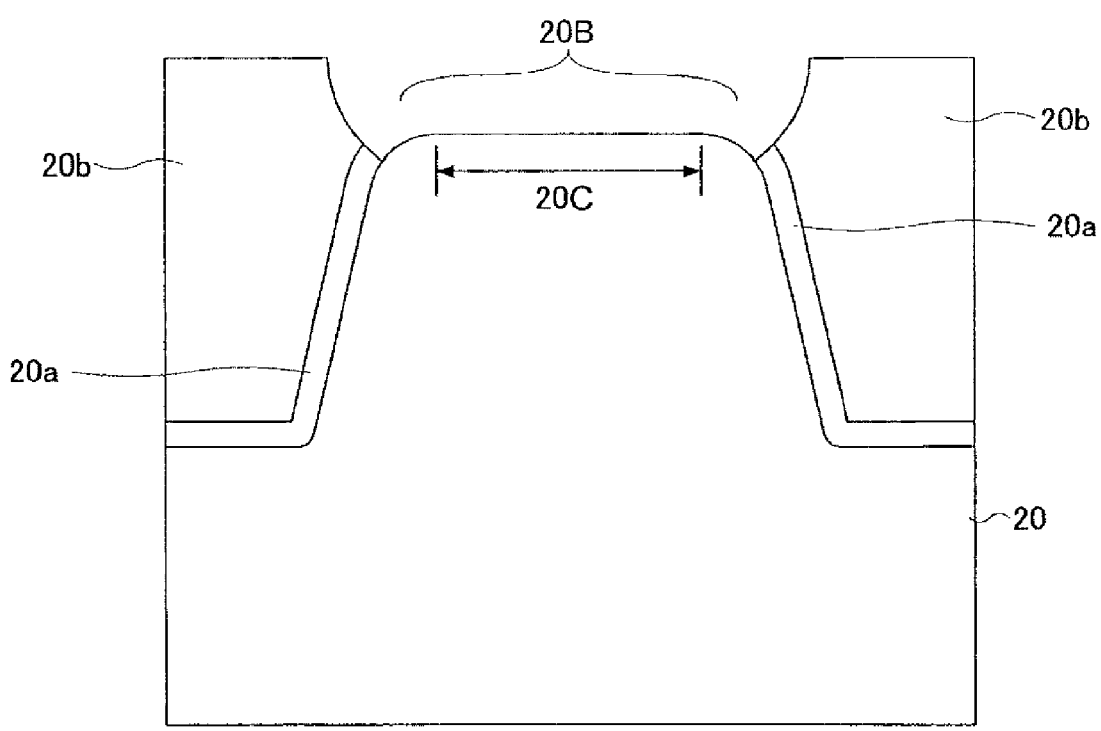

Further, in the step of FIG. 4E, the SiN pattern 21B is removed by a processing in a pyrophosphoric acid, and the thermal oxide film 21A is removed together with the surrounding thermal oxide film 20a by a wet etching process while using an HF aqueous solution. Thereby, a structure in which the corner part of the device region 20B is rounded.

Because the device region 20B has such a rounded corner in the structure of FIG. 4E, the occurrence of leakage caused by concentration of electric field in such a corner part is suppressed even when a high-voltage device such as a flash memory is formed in the device region 20B. On the other hand, as a result of such rounding processing, the area of the flat silicon substrate surface 20C that can be used for device formation is decreased inevitably. Because of this reason, a large area is secured for the device region 20B in the conventional flash memory devices.

Meanwhile, when such a flash memory is formed on a semiconductor substrate simultaneously with a high-speed logic device such as CMOS or an SRAM, it should be noted that the rounding processing of FIG. 4C that rounds the corner part of the device region by thermal oxidation processing, causes rounding also in the device region of such high-speed logic device or SRAM, and the effective area of the device region is decreased inevitably. Because high-speed logic devices or SRAMs operating at low voltage are designed to have a small device region from the beginning, such a thermal oxidation processing used at the time of fabrication of a flash memory for rounding the device region causes excessive decrease of effective device area, and there is caused a non-trivial effect on the operational characteristics of the semiconductor device.

Thus, the inventor of the present invention has investigated the problem, in the investigation constituting the foundation of the present invention, that arises with the rounding processing of the corner part of the device region by applying the process of FIGS. 4A-4E to the silicon substrate having the STI structure optimized for the high-speed logic devices or SRAMs.

Figure 5:
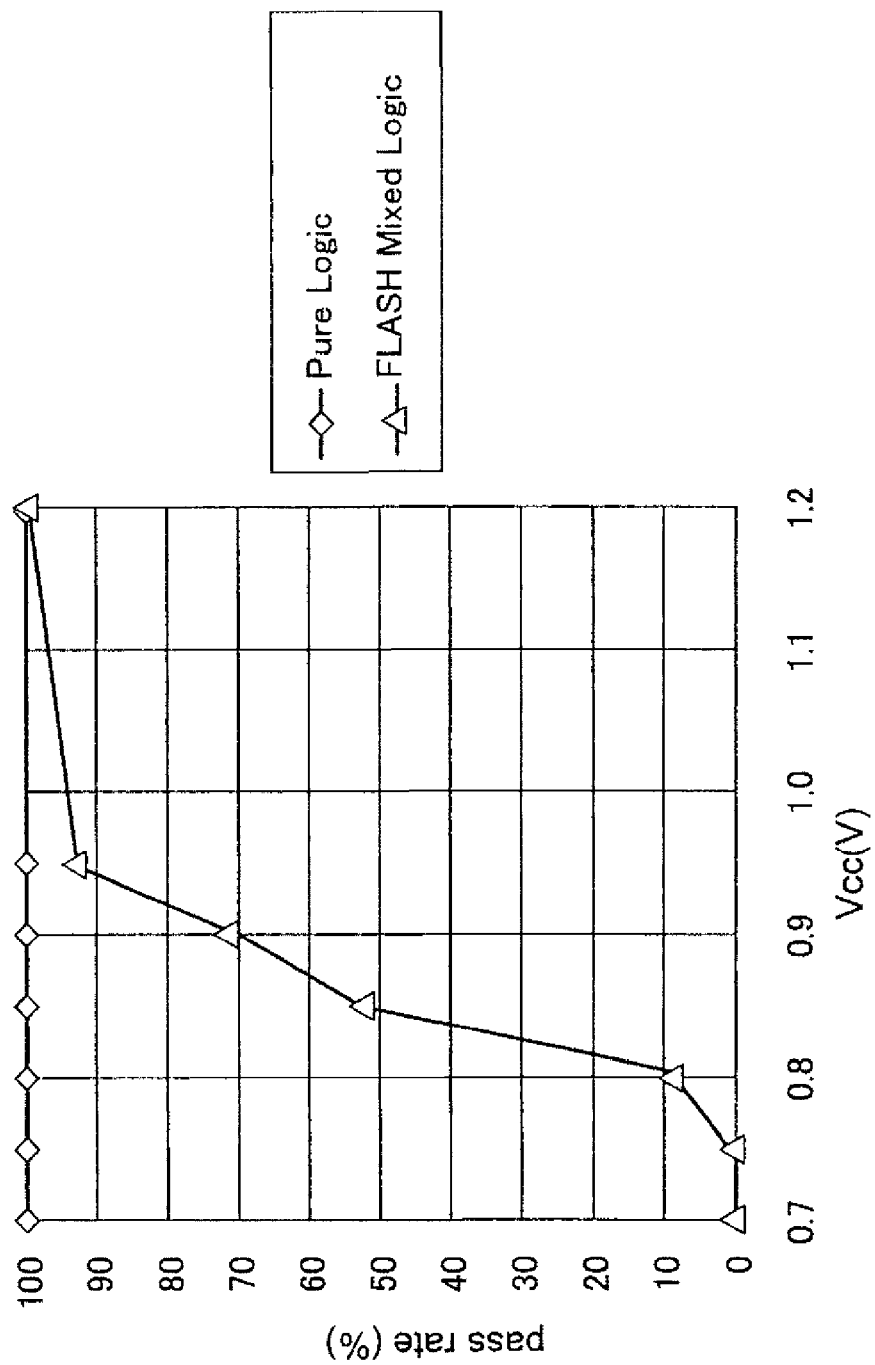
FIG. 5 is a diagram showing the operational margin of an SRAM integrated with a flash memory in comparison with an SRAM not integrated with a flash memory.

FIG. 5 shows the result of verification of the write/read operation conducted for an SRAM integrated with a flash memory on a common silicon substrate while changing the operational voltage Vcc, wherein the SRAM is the device having a nominal operational voltage of 0.8V. In FIG. 5, Δ shows the case the SRAM is integrated with the flash memory, while ◇ shows the case in which only the SRAM is formed on the substrate.

Referring to FIG. 5, in the case only the CMOS device and the SRAM are formed on the substrate but not with the flash memory device, it will be noted that a normal read/write operation is confirmed up to the case in which the operational voltage Vcc has dropped to 0.7V, indicating that the SRAM thus formed has sufficient operational voltage margin. On the other hand, in the case the flash memory is further integrated on the same substrate together with the CMOS device and the SRAM, on the other hand, there starts to appear an SRAM device failing to show normal read/write operation when the operational voltage has decreased below 1.2 W. Particularly, when the operational voltage has dropped to 0.7V, it will be noted that most of the SRAMs can no longer perform normal read/write operation.

Figure 6:
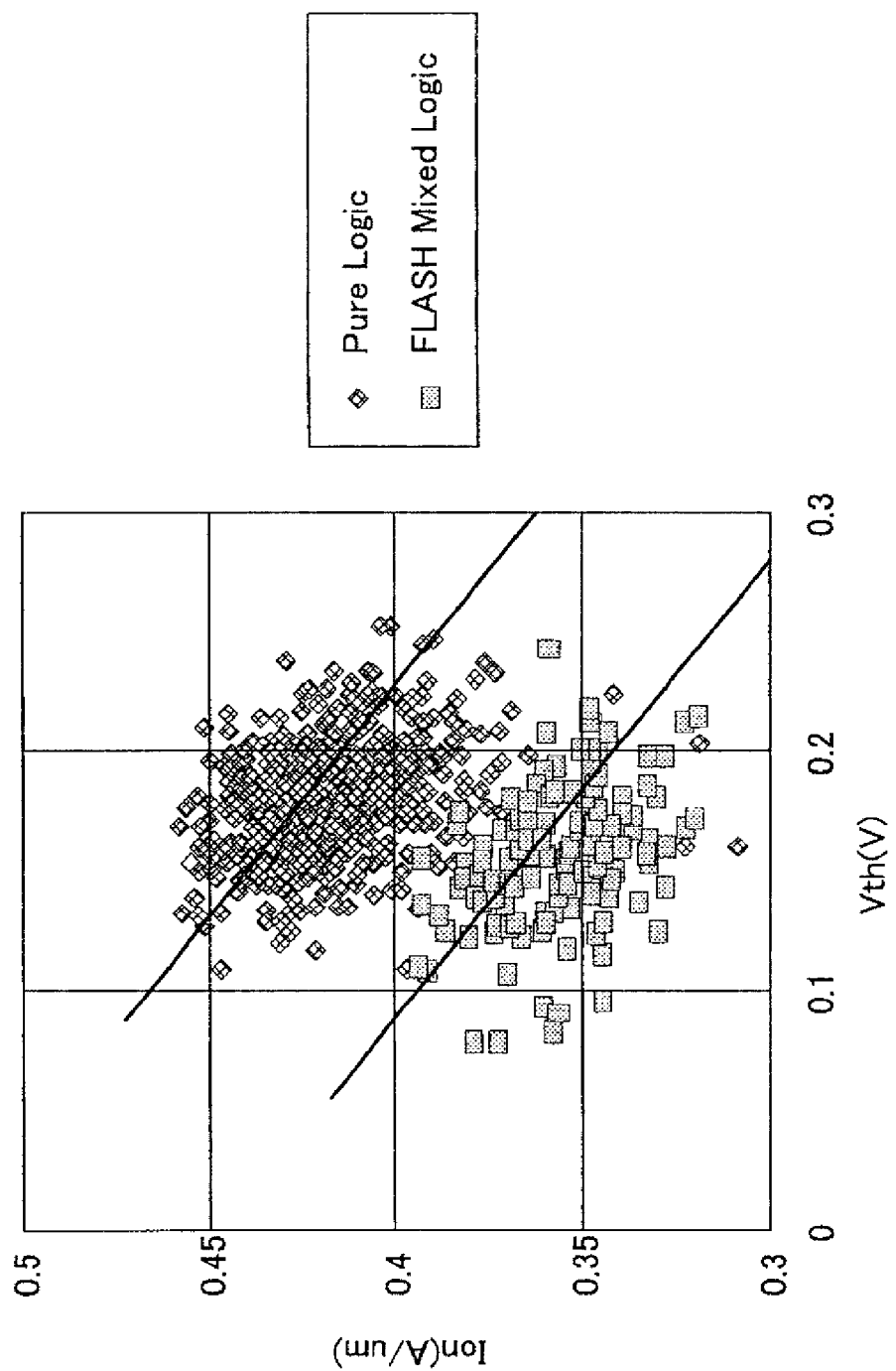
FIG. 6 is a diagram showing the ON current of a transistor constituting an SRAM integrated with a flash memory in comparison with that of an SRAM not integrated with a flash memory.
Figure 7:
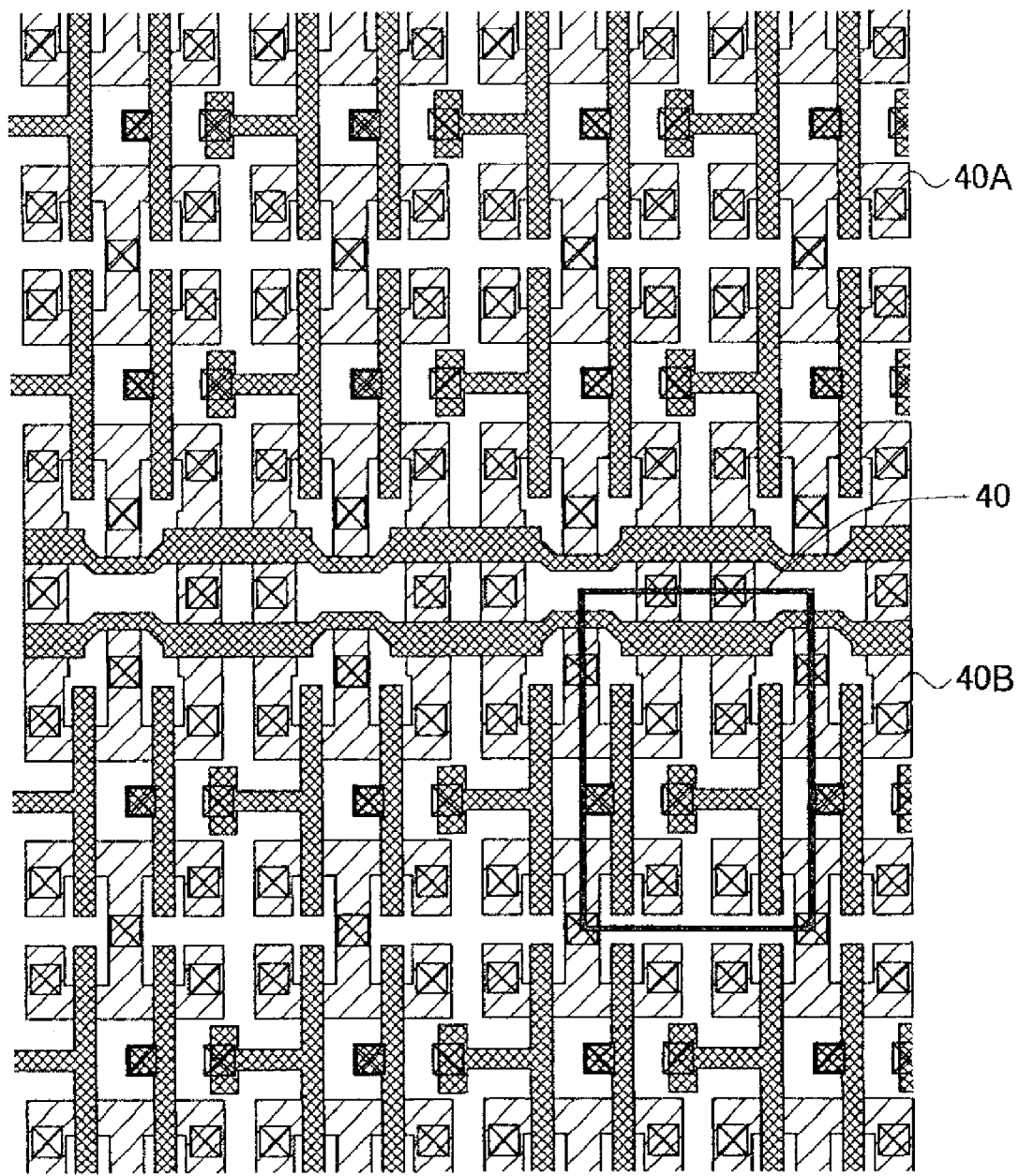
FIG. 7 is a diagram showing the layout of an SRAM according to a first embodiment of the present invention.

FIG. 6 shows the result of the threshold voltage of the transfer transistor constituting the SRAM and the ON current included in the specimen of FIG. 7.

Referring to FIG. 6, there is caused a decrease of the ON current of 10% or more in the case the flash memory is formed on the substrate as compared with the case in which the flash memory is not formed, indicating that there is caused a decrease of the drain current caused as a result of the substantial decrease of width of the device region 20C explained with reference to FIG. 4E. When such a decrease of the drain current is caused in the transfer transistor of an SRAM, there is caused a serious problem such as failure of read/write operation of the SRAM when minute fluctuation is caused in the supply voltage.

This problem can be solved if the device area of the SRAM is increased. However, such increase of the device area of an SRAM invites increase of the chip area, leasing to increase of manufacturing cost of the semiconductor device. In addition, it becomes necessary to redesign the SRAM (redesigning of macros), while this causes increase of developing cost and also increase of developing process steps.

First Embodiment

Figure 8:
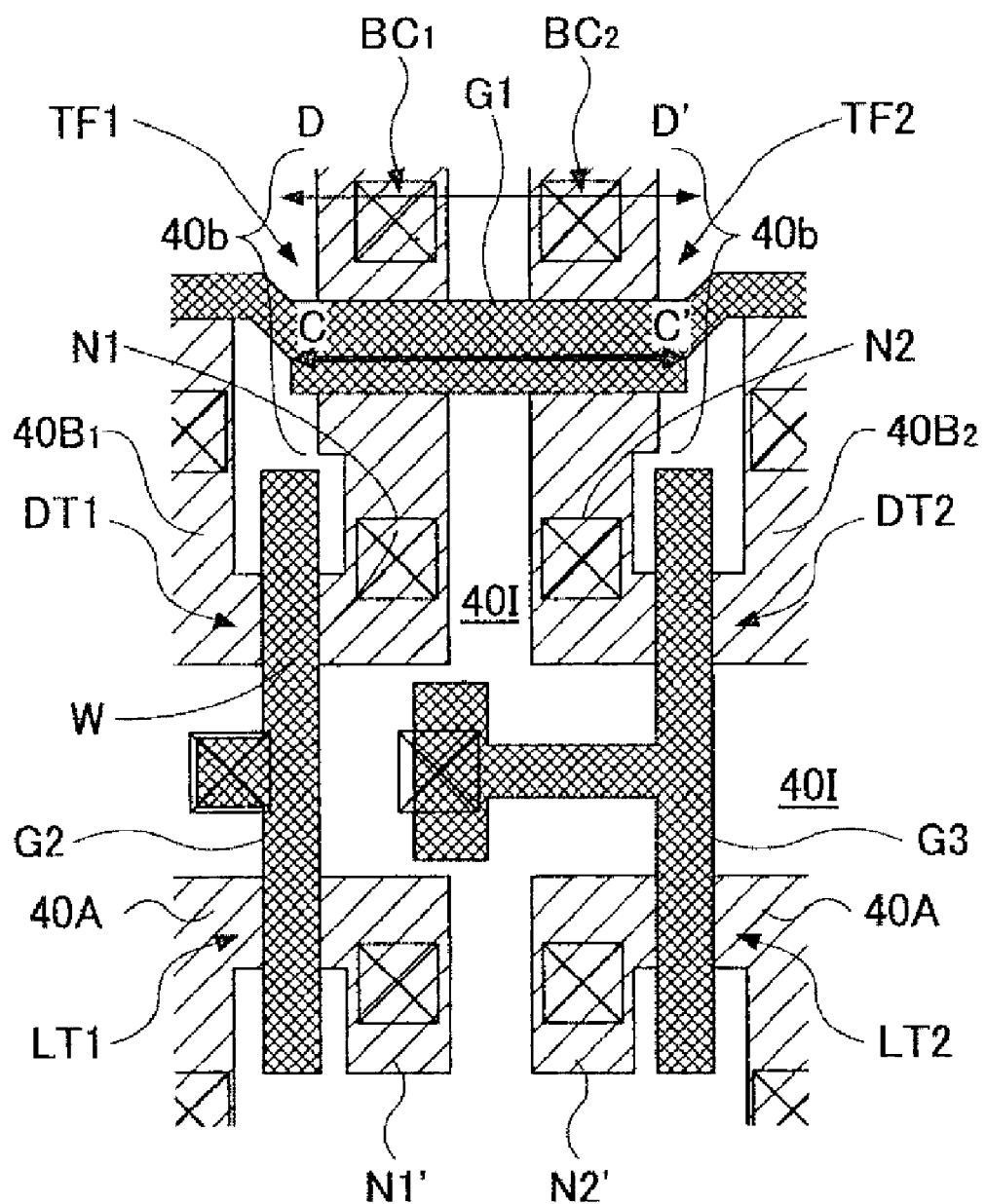
FIG. 8 is a diagram showing a part of the layout of FIG. 7.

FIG. 7 is a plan view showing the layout of an SRAM 40 according to a first embodiment of the present invention, while FIG. 8 is a plan view showing the layout of one memory cell in the memory cell array of FIG. 7.

Figure 1:
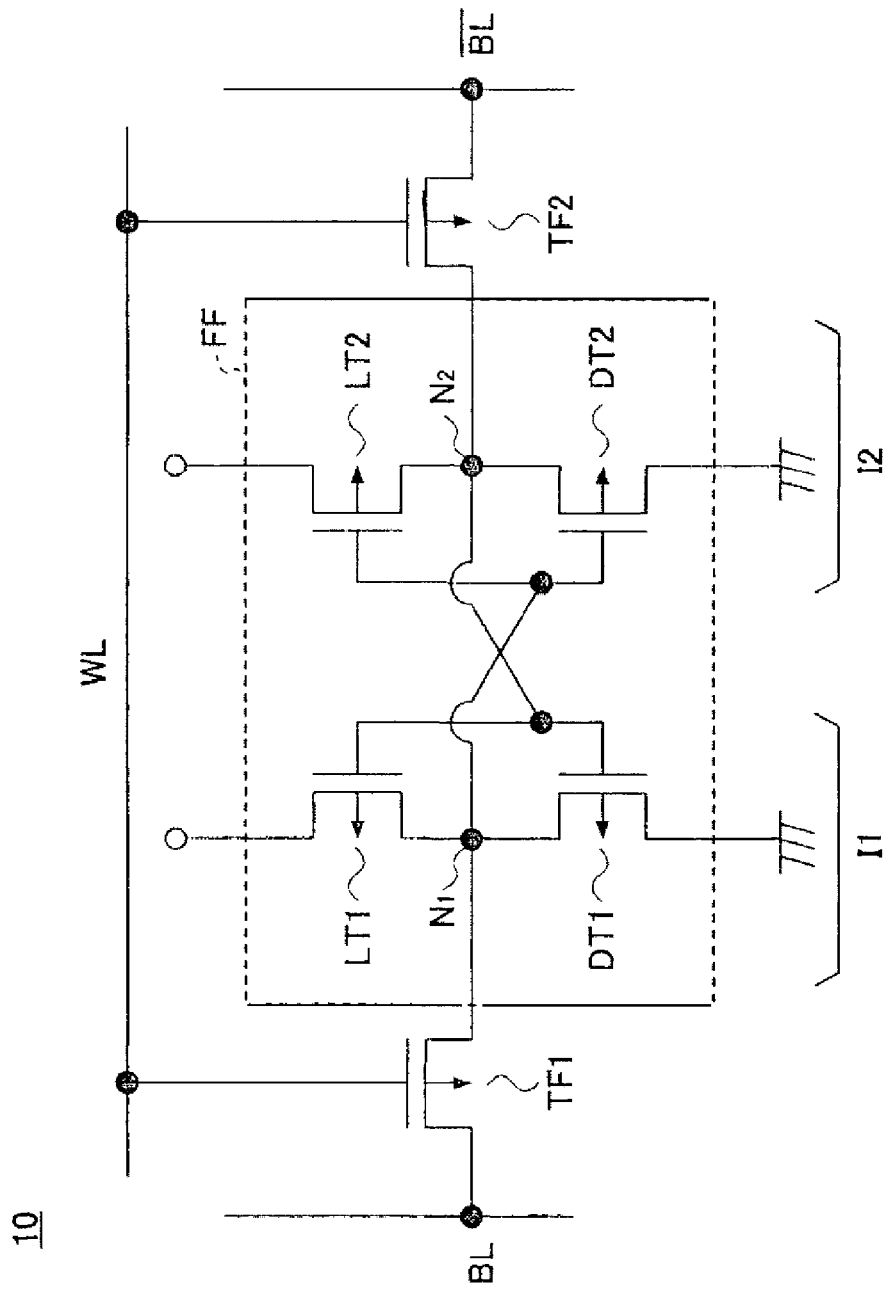
FIG. 1 is a circuit diagram showing the construction of a conventional SRAM.

Referring to FIGS. 7 and 8, the SRAM 40 has an equivalent circuit diagram identical with that of the SRAM 10 of FIG. 1, and includes a flip-flop circuit FF formed of a first CMOS inverter I1 in which a first load transistor LT1 of a p-channel MOS transistor and a first driver transistor DT2 of an n-channel MOS transistor are connected in series, and a second CMOS inverter I2 in which the a second load transistor LT2 of a p-channel MOS transistor and a second driver transistor LD2 of an n-channel MOS transistor are connected in series, wherein the connection node N1 connecting the first load transistor LT1 and the first driver transistor DT1 together is connected to a first bit line BL via a first transfer transistor TF1 formed of an n-channel MOS transistor and controlled by the word line WL and further a first bit contact BC1. Similarly, the connection node N2 connecting the second load transistor LT2 and the second driver transistor DT2 is connected to a second bit line/BL via a second transfer transistor TF2 of an n-channel MOS transistor and controlled by the word line WL and the second bit contact BC2.

In the SRAM of such a construction, it is very important that the load transistors LT1 and LT2 driving the driver transistors DT1 and DT2 have sufficient current drivability for the high-speed operation of the SRAM.

Referring to FIG. 7, there are formed device regions 40A and device regions 40B on the surface of the silicon substrate in a row and column formation in the state surrounded by the STI device isolation structure 40I, wherein a part of the device region 40A and a part of the device region 40B constitute the memory cell having the circuit construction of FIG. 1 as represented in FIG. 8.

Referring to FIG. 8, the transfer transistors TF1 and TF2 share a gate electrode G1, while the load transistor LT1 and the load transistor DT1 share a gate electrode G2. Further, the load transistor LT2 and the driver transistor DT2 share a gate electrode G3.

Further, the node N1 of FIG. 1 is provided by the diffusion region shared by the transfer transistor TF1 and the driver transistor DT1, wherein the node N1 is connected to a corresponding diffusion region N1' of the load transistor LT1 via an interconnection pattern not illustrated. Similarly, the node N2 of FIG. 1 is provided by the diffusion region shared by the transfer transistor TF2 and the driver transistor DT2, while the node N2 is connected to a corresponding diffusion region N1' of the load transistor LT2 by an interconnection pattern not illustrated.

Further, the gate electrode G2 is connected to the node N2 by an interconnection pattern not illustrated, and the gate electrode G3 is connected to the node N1 similarly by an interconnection pattern not illustrated.

In the present embodiment, it should be noted that the transfer transistors TF1 and TF2 are formed in the respective, mutually neighboring device regions 40B1 and 40B2 in correspondence to the parallel extending parts 40b neighboring with each other across the STI structure 40I, wherein it should be noted that each of the parts 40b on which the transfer transistor TF1 or TF2 is formed has an increased width W such that the gate width of the transistors TF1 and TF2 is increased.

With this, the problem of decrease of the gate width of the transfer transistor and associated decrease of the ON current thereof, caused by the rounding processing of the device region conducted by a thermal oxidation processing such as the one explained with reference to FIG. 4C, is effectively compensated for, in the case a non-volatile semiconductor device operating at a high voltage such as a flash memory is formed also on the same substrate.

Thereby, it should be noted that the expansion of the device region parts 40b of the device regions 40B1 and 40B2 is conducted in the mutually opposing directions with respect to the device regions 40B1 and 40B2. Thereby, there is caused no problem that the width of the STI structure 40, formed between the device regions 40B1 and 40B2 with a predetermined width determined by the design rule, is reduced. Thus, the construction of FIG. 8 has a feature in that the mutually opposing edges of the device regions 40B1 and 40B2 are defined straight edge lines.

Further, it should be noted that, because the expansion of the device region is made in mutually opposite directions in the device regions 40B1 and 40B2, the bit line contact BC1 formed in the device region 40B1 is relatively offset with respect to the device region 40B1 toward the device region 40B2. Further, the bit line contact BC2 formed in the device region 40B2 is relatively offset with respect to the device region 40B2 toward the device region 40B1. Because the bit line contacts BC1 and BC2 are formed with a predetermined pitch with a predetermined design rule. Thus, the expansion of the device region as shown in FIG. 8 does not cause any real displacement offset of the bit line contact BC1 or BC2.

In the layout of FIG. 8, it should be noted that there is made no expansion of the device region width W in the part of the device regions 40B1 and 40B2 beyond the contact N1 or N2. With this, variation of characteristics of the driver transistor DT1 or DT2 formed in the U-shaped part of the device region 40B1 or 40B2 beyond the contact N1 or N2, is successfully avoided.

In more detail, there is caused a rounded part also in the foregoing U-shaped part of the device region 40B1 or 40B2 when the foregoing expansion part is formed up to the part near the contact N1 or N2 because of the proximity effect that appears at the time of exposure of the device regions, and there arises a situation in which the gate electrode of the driver transistor DT1 or DT2 crosses the device region in such a rounded part. In such a structure, the gate width of the driver transistor DT1 or DT2 changes significantly when there is caused a minute displacement in the gate electrode position, and it becomes difficult to achieve the desired SRAM operation. It should be noted that the layout of FIG. 8 can avoid such a problem.

Second Embodiment

Figure 9A:
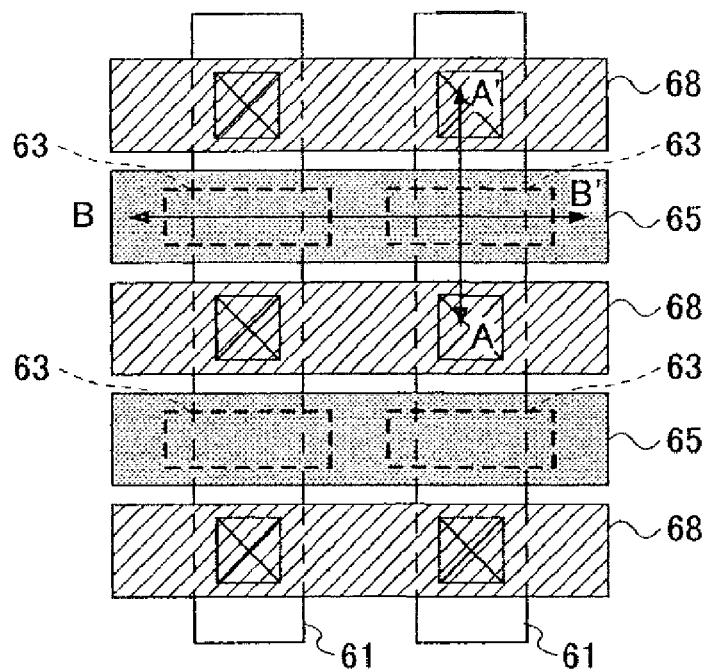
FIGS. 9A and 9B are diagrams showing the layout and equivalent circuit of a flash memory integrated with an SRAM according to a second embodiment of the present invention.
Figure 9B:
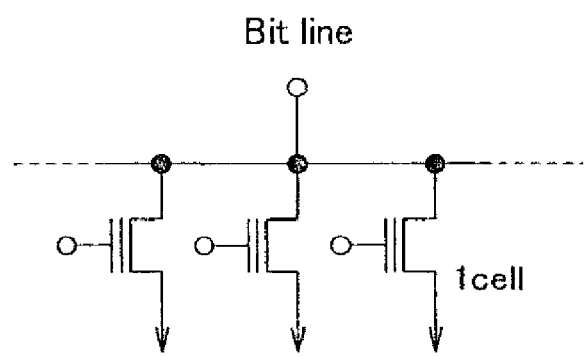
Figure 10A:
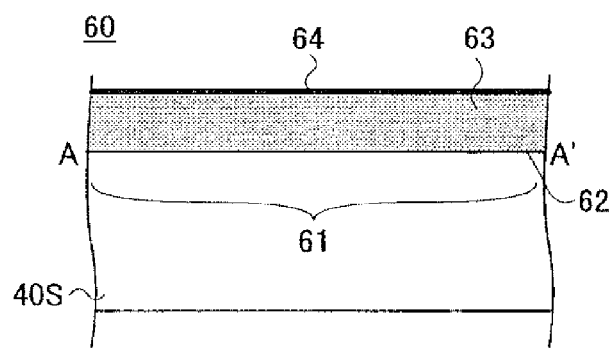
FIGS. 10A-10D are diagrams showing the fabrication process of a semiconductor device according to the second embodiment in which the SRAM of FIG. 8 and the flash memory of FIGS. 9A and 9B are integrated.
Figure 10B:
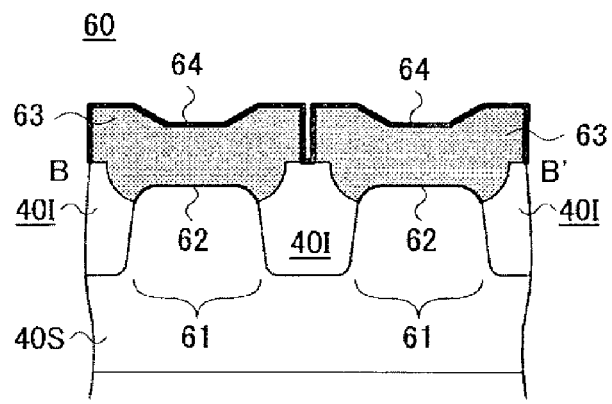
Figure 10C:
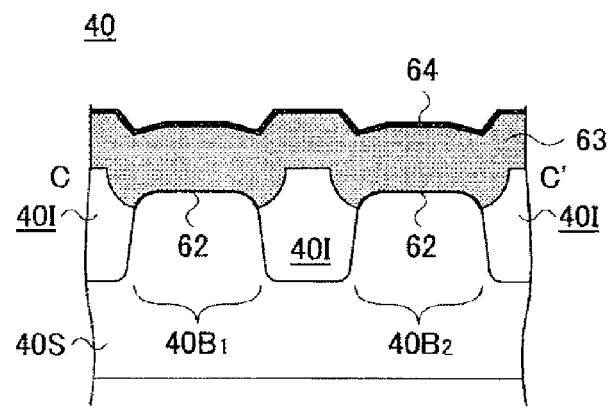
Figure 10D:
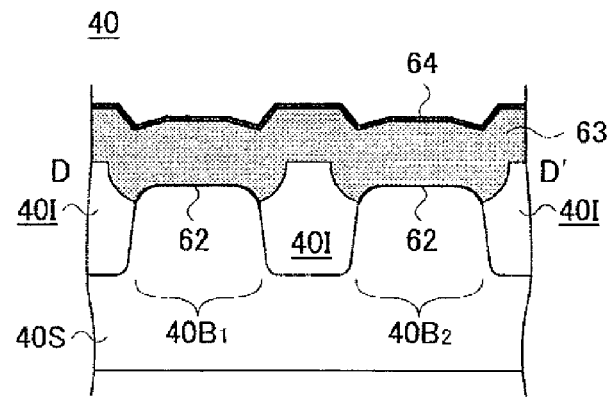

FIG. 9A is a diagram showing the layout of an NOR type flash memory 60 having an equivalent circuit diagram of FIG. 9B and integrated on a common silicon substrate together with the SRAM of FIGS. 7 and 8.

Figure 11A:
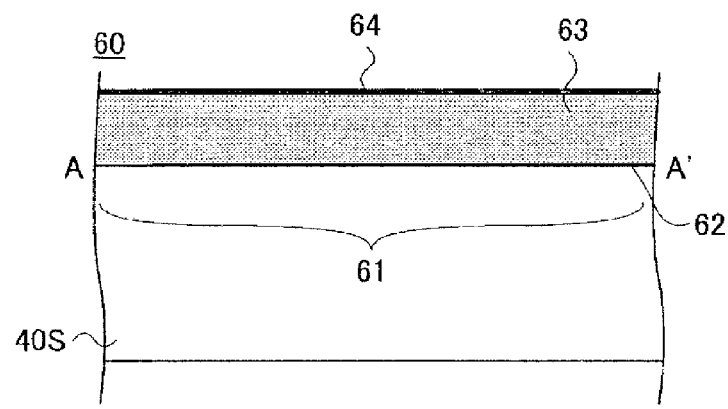
FIGS. 11A-11D are further diagrams showing the fabrication process of a semiconductor device according to the second embodiment in which the SRAM of FIG. 8 and the flash memory of FIGS. 9A and 9B are integrated.
Figure 11B:
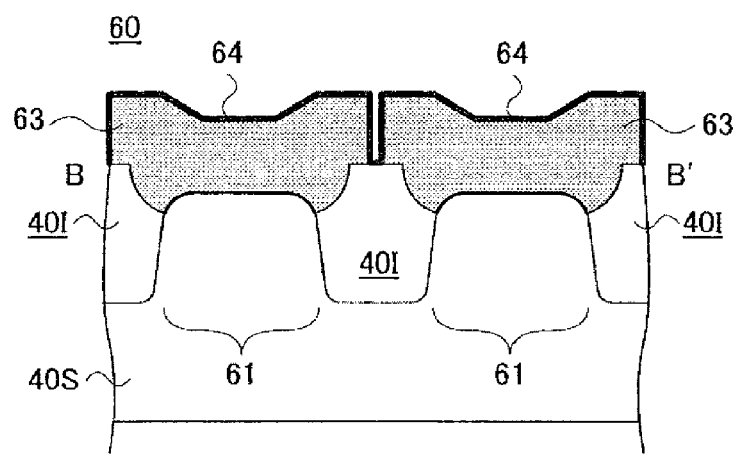
Figure 11C:
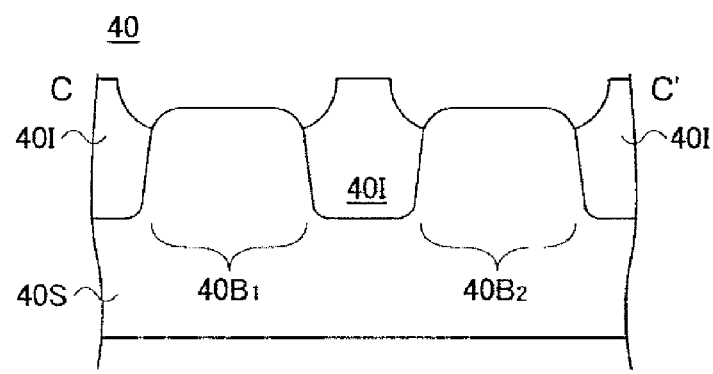
Figure 11D:
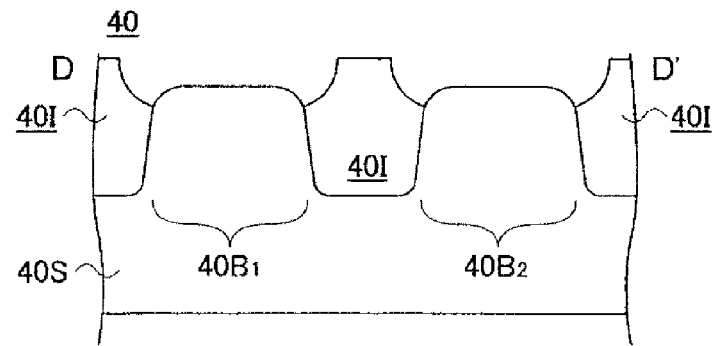
Figure 12A:
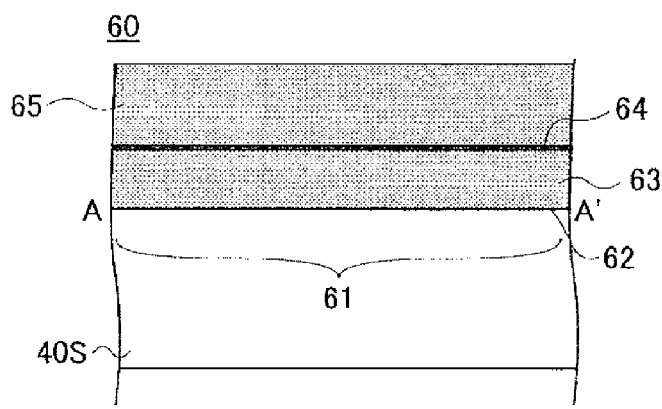
FIGS. 12A-12D are still further diagrams showing the fabrication process of a semiconductor device according to the second embodiment in which the SRAM of FIG. 8 and the flash memory of FIGS. 9A and 9B are integrated.
Figure 12B:
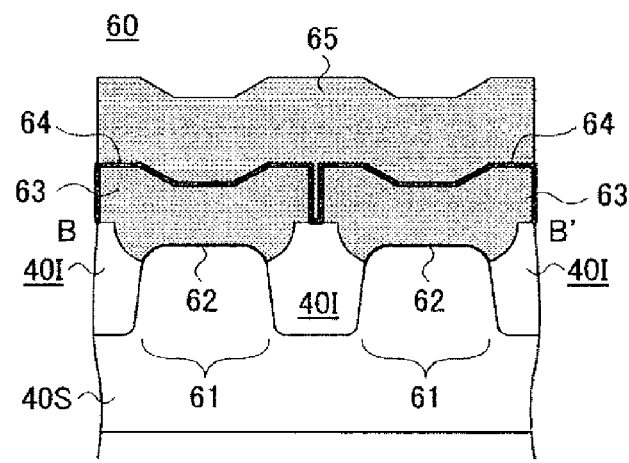
Figure 12C:
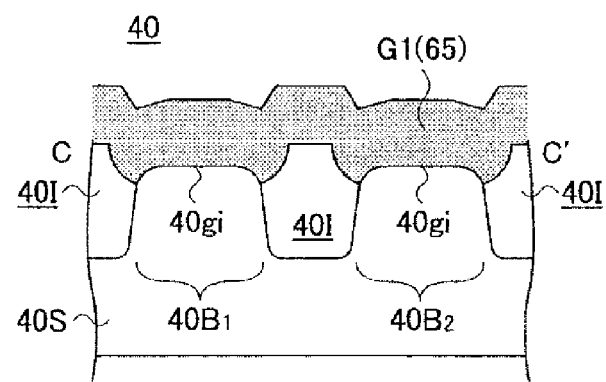
Figure 12D:
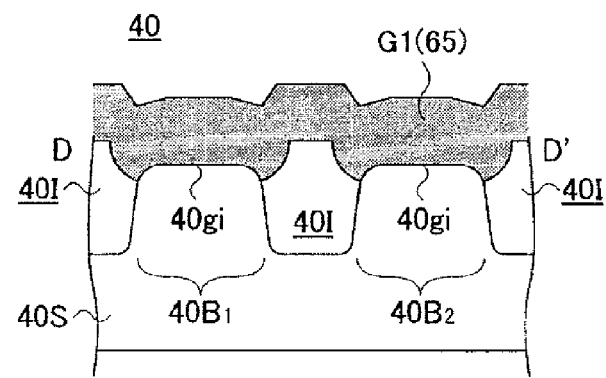

Referring to FIG. 11A, there are formed active regions 61 of the flash memory 60 on the same silicon substrate on which the SRAM 40 is formed parallel with each other, wherein there extends a floating gate pattern 63 on the silicon substrate via a tunnel insulation film 62 not illustrated in FIG. 9A so as to cross the active region 61. Further, on the floating gate pattern 63, there is formed a control electrode pattern 65 via an ONO capacitive coupling film 64 not illustrated in FIG. 9A in such a manner that the control electrode pattern 65 crosses the active region 61 and forms a word line.

Further, in the active region 61, there are formed a bit line 68 and a source line 67 at both lateral sides of the control electrode pattern 65.

Hereinafter, the fabrication process of a semiconductor integrated circuit device that includes the NOR type flash memory 60 of FIG. 9A and the SRAM 40 of FIG. 8 on a common semiconductor substrate will be described with reference to FIGS. 10A-10D, FIGS. 11A-11D, FIGS. 12A-12D, FIGS. 13A-13D, FIGS. 14A-14D and FIGS. 15A-15D, wherein explanation for the flash memory 60 will be made with regard to the A-A' and B-B' cross-sections shown in FIG. 9A while the explanation for the SRAM 40 will be made with regard to the C-C' and D-D' cross-sections of FIG. 8. Here, it should be noted that FIGS. 10A-15A show the A-A' cross-section of the flash memory 60, while FIGS. 10B-15B show the B-B' cross-section of the flash memory 60. Further, FIGS. 10C-15C show the C-C' cross-section of the SRAM 40, while FIGS. 10D-15D show the cross-section of the DRAM 40.

Referring to FIGS. 10A-10D at first, it will be noted that the STI device isolation structure 40I is already formed on a silicon substrate 40S, and there are already formed various wells, channel stop diffusion regions, channel dope diffusion regions, and the like on the surface of the silicon substrate 40S in correspondence to the respective device regions as shown in FIGS. 10A-10D. Associated with formation of such device regions, the device regions 40B1 and 40B2 of the SRAM 40 and the device region 61 of the flash memory are applied with the thermal oxidation processing explained previously with reference to FIG. 4B, and as a result, the corner part is rounded in these device regions.

Further, in the step of FIGS. 10A-10D, there is formed a thermal oxide film on the silicon substrate 40S in correspondence to the respective device regions with the thickness of 10 nm as the tunneling insulation film 62 of the flash memory 60.

Further, an amorphous silicon film doped with P (phosphorus) to n+-type is formed on the tunneling insulation film 62 with the thickness of 80-120 nm in correspondence to the floating gate pattern 63 by a low-pressure CVD process. In the step of FIGS. 10A-10D, the amorphous silicon film 63 is patterned in the form of bands in corresponding to the device region 61 of the flash memory 60 as can be seen in the B-B' cross-section of FIG. 10B, wherein the surface of the amorphous silicon film 63 is covered with an ONO film 64.

Next, in the step of FIGS. 11A-11D, the tunneling insulation film 62, the amorphous silicon film 63 and the ONO film 64 are removed from the region where the SRAM 40 is to be formed, and a thermal oxidation processing is conducted to the structure of FIGS. 11A-11D in the step of FIGS. 12A-12D. Thereby, a thermal oxide film 40gi is formed on the exposed surface of the device regions 40B1 and 40B2 with the thickness of about 2 nm as the gate insulation film of the transfer transistors TF1 and TF2 and also other MOS transistors constituting the foregoing SRAM 40. In the steps of FIGS. 12A-12D, there is further formed the polysilicon film 65 on the silicon substrate with the thickness of about 200 nm as the control electrode pattern of the flash memory 40 and also the gate electrodes of the respective transistors constituting the SRAM 40.

Further, in the step of FIGS. 13A-13D, the polysilicon film 65, the ONO film 64 and the amorphous silicon film 63 underneath the polysilicon film 65, the tunneling insulation film 62 further underneath the amorphous silicon film 63 are patterned in the region where the flash memory 60 is to be formed, wherein the amorphous silicon film 63 thus patterned form the floating gate electrode pattern of the flash memory 60, while the polysilicon film 65 thus patterned form the control electrode pattern of the flash memory 60. Thereby, the floating gate 63, the ONO film 64 and the control electrode pattern 65 form a stacked gate structure 60SG of the flash memory 60.

At the same time, the polysilicon film 65 and the underlying thermal oxide film 40gi are patterned in the region of the SRAM 40, and gate electrode patterns and corresponding gate insulation film patterns are formed in correspondence to the MOS transistors constituting the SRAM 40. In the cross-section of FIG. 13C, it should be noted that the polysilicon pattern thus formed constitutes the gate electrode G1.

Figure 13A:
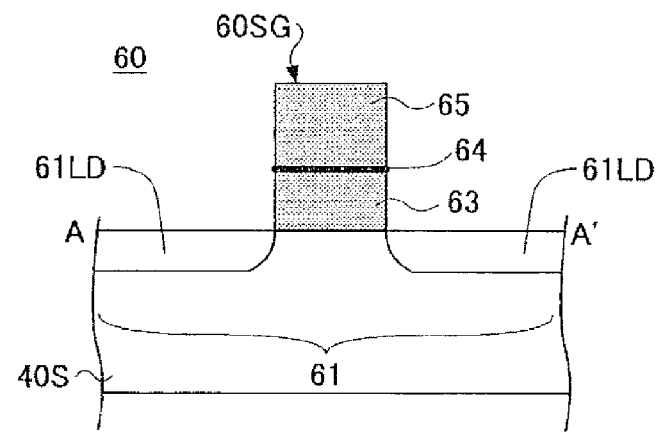
FIGS. 13A-13D are still further diagrams showing the fabrication process of a semiconductor device according to the second embodiment in which the SRAM of FIG. 8 and the flash memory of FIGS. 9A and 9B are integrated.
Figure 13B:
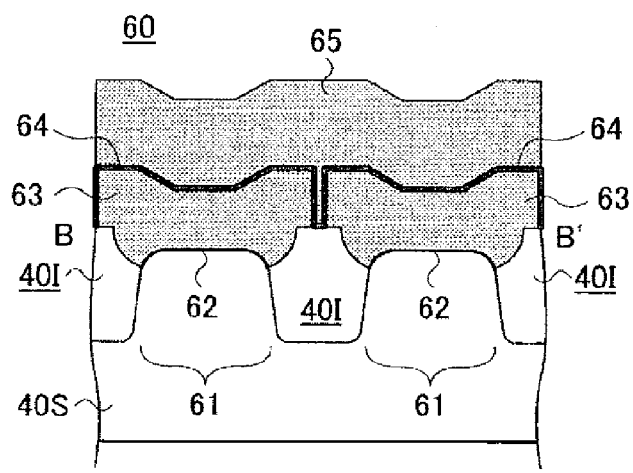
Figure 13C:
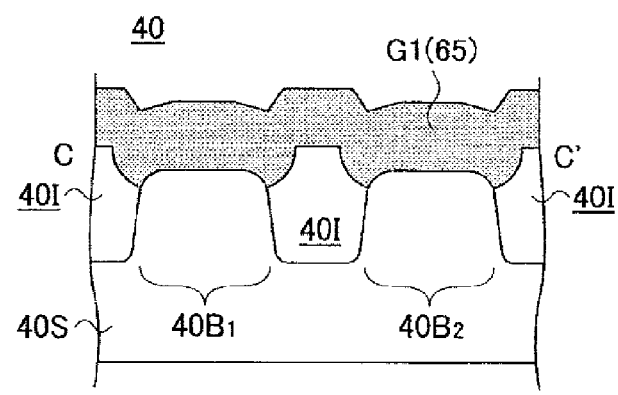
Figure 13D:
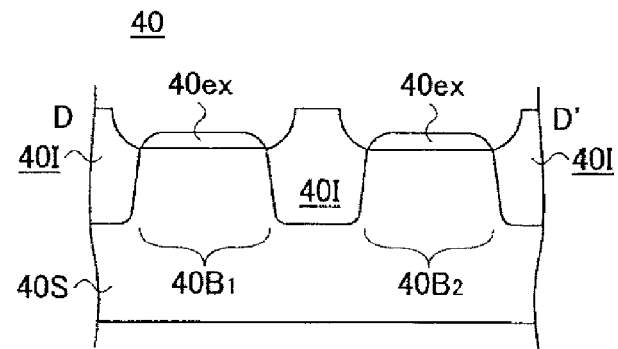
Figure 14A:
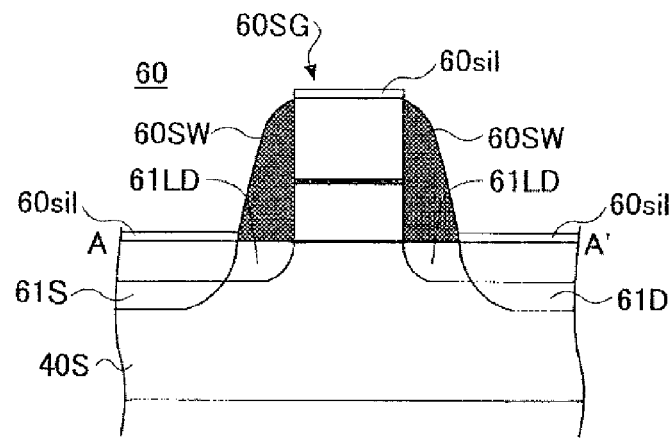
FIGS. 14A-14D are still further diagrams showing the fabrication process of a semiconductor device according to the second embodiment in which the SRAM of FIG. 8 and the flash memory of FIGS. 9A and 9B are integrated.
Figure 14B:
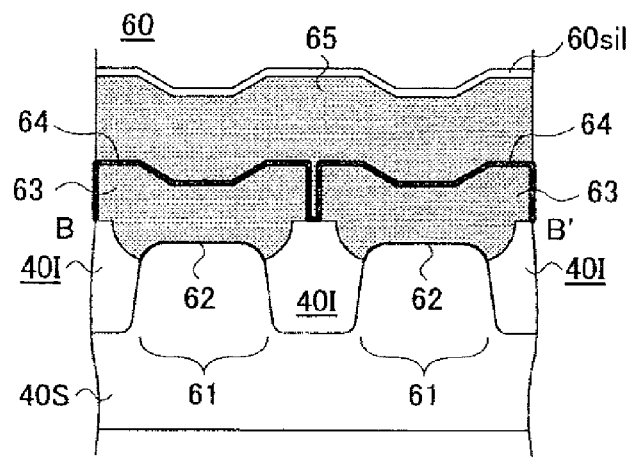
Figure 14C:
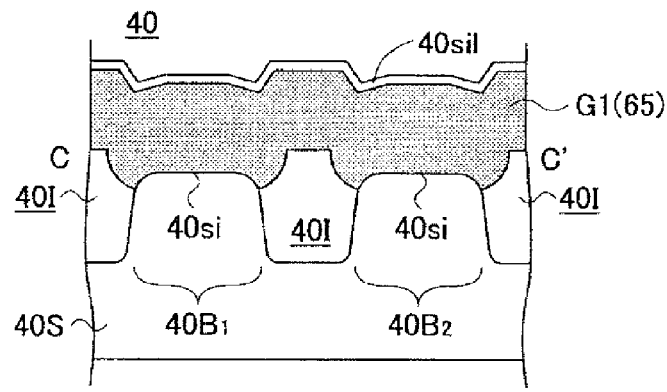
Figure 14D:
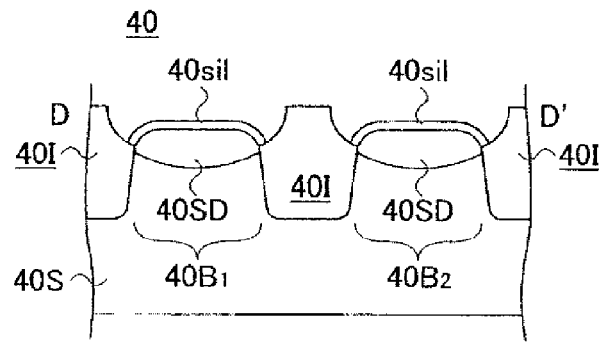
Figure 15A:
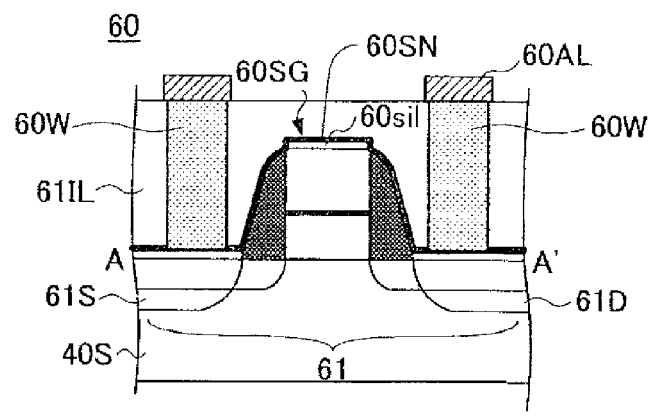
FIGS. 15A-15D are further diagrams showing the fabrication process of a semiconductor device according to the second embodiment in which the SRAM of FIG. 8 and the flash memory of FIGS. 9A and 9B are integrated.
Figure 15B:
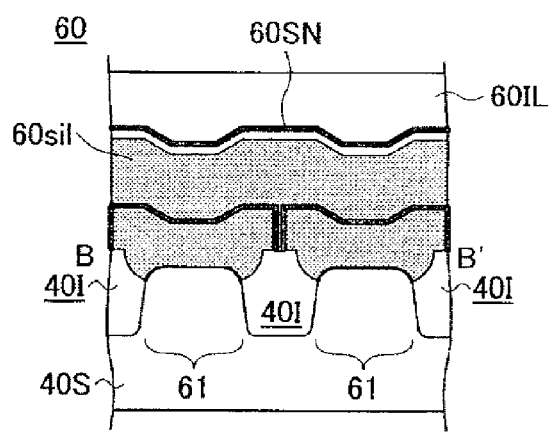
Figure 15C:
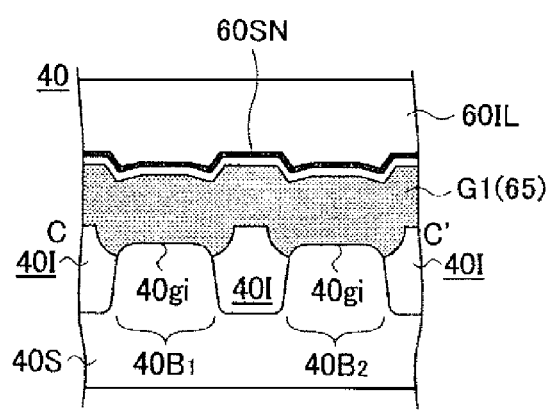
Figure 15D:
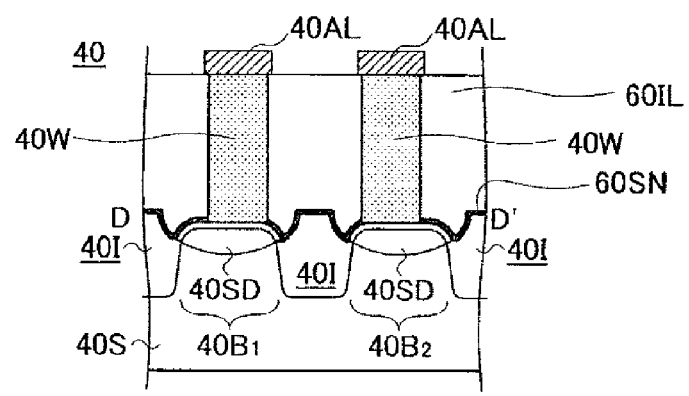

Further, in the steps of FIGS. 13A-13D, ion implantation of an n-type impurity element is conducted while using the polysilicon pattern 65 thus formed as a mask, and there are formed n-type diffusion regions 61LD at both lateral sides of the gate structure 60SG in the device region of the flash memory 60 as the LDD region of the flash memory 60. Further, as a result of such ion implantation, diffusion regions 40ex are formed in the device regions 40B1 and 40B2 of the SRAM 40 at both lateral sides of the gate electrode pattern G1 as shown in FIG. 13D as the source and drain extension regions of the MOS transistor.

Further, in the step of FIGS. 14A-14D, sidewall insulation films 60SW are formed on both sidewall surfaces of the stacked gate structure 60SG. Further, while not illustrated, similar sidewall insulation films are formed on also both sidewall surfaces of the gate electrode G1. Further, ion implantation of an impurity element is conducted into the silicon substrate 40S while using the sidewall insulation film as a mask, and there are formed diffusion regions 61S and 61D in the device region of the flash memory 60 at the outer sides of the LDD regions 61LD in a partially overlapped relationship therewith, as the source and drain regions of the flash memory 60. Further, in the device region of the SRAM 40, there are formed source and drain diffusion regions 40SD of the MOS transistor constituting the SRAM 40 such as the transfer transistors TF1 and TF2 at the outer sides of the source and drain extension regions 40*ex* in a partially overlapping relationship therewith.

Further, in the step of FIGS. 14A-14D, there are formed cobalt silicide layers 60*sil* on the stacked gate structure 60SG and also the source and drain regions 61S and 61D of the flash memory 60 by a salicide process. At the same time, cobalt silicide layers 40*sil* are formed also in the SRAM 40 on the gate electrode G1 and also on the source and drain regions 40SD by a salicide process.

Next, in the step of FIGS. 15A-15D, the structures of FIGS. 14A-14D are covered with an SiN protection film 60SN having a thickness of about 50 nm, and an interlayer insulation 60IL of a silicon oxide film is formed thereon by a high-density plasma CVD process.

Further, there are formed contact plugs 60W of W (tungsten) in the interlayer insulation film 60IL in correspondence to the device region 61 so as to make contact with the diffusion regions 61S and 61D, and an Al interconnection pattern 60AL is provided on the interlayer insulation film 60IL, wherein the contact plugs 60W are formed so as to make contact with the Al interconnection pattern 60AL, which is formed with a predetermined design rule.

Similarly, there are formed contact plugs 40W in the interlayer insulation film 60IL in correspondence to the device regions 40B1 and 40B2 in contact with the source and drain diffusion regions 40SD, and an Al interconnection pattern 40AL is formed on the interlayer insulation film, wherein the contact plugs 40W are formed so as to make contact with the Al interconnection pattern 40AL, which is formed with a predetermined design rule.

According to the present invention, it becomes possible to eliminate the problem, occurring in an SRAM device integrated with a high-voltage device operating at high voltage such as a flash memory, of decrease of the ON current caused by the decrease of gate width in the transfer transistor of the SRAM in particular at the time of rounding processing of the device region on a semiconductor substrate conducted by a thermal oxidation processing for high-voltage operation of the high-voltage device, without changing the cell size of the transistor. Because of this, it becomes possible with the present invention to use the same cell size for the SRAM in any of the semiconductor device in which a logic device is integrated together with the SRAM on a common substrate and the semiconductor device in which a non-volatile memory device such as a flash memory is integrated in addition to the logic device and the SRAM on a common substrate. Thereby, designing and manufacture of semiconductor devices are facilitated with the present invention.

Further, in the present invention, it should be noted that the flash memory is not limited to the NOR type shown in FIG. 11 but a device of NAND type can also be used.

Further, the present invention is not limited to the embodiments described heretofore, but various variations and modifications may be made without departing from the scope of the present invention.

What is claimed is:

1. A semiconductor device, comprising:
a semiconductor substrate;
an SRAM including a plurality of static random access memory cells on the semiconductor substrate, each of the plurality of static random access memory cells comprising:
a first CMOS inverter including a first n-channel MOS transistor and a first p-channel MOS transistor connected in series at a first node;
a second CMOS inverter including a second n-channel MOS transistor and a second p-channel MOS transistor connected in series at a second node, said second CMOS inverter forming a flip-flop circuit together with said first CMOS inverter;
a first transfer transistor provided between a first bit line and said first node, said first transfer transistor having a first gate electrode connected to a word line, said first transfer transistor being activated by a selection signal on said word line; and
a second transfer transistor provided between a second bit line and said second node, said second transfer transistor having a second gate electrode connected to said word line, said second transfer transistor being activated by the selection signal on said word line,
said first transfer transistor and said second transfer transistor being formed respectively on first and second device regions defined on the semiconductor substrate by a device isolation region of a STI structure so as to extend in parallel with each other,
said first transfer transistor contacting with said first bit line at a first bit contact region on said first device region,
said second transfer transistor contacting with said second bit line at a second bit contact region on said second device region,
wherein said first and second device regions have respective first and second parts extending parallel with each other, said first transfer transistor being formed on said first part of said first device region, said second transfer transistor being formed on said second part of said second device region,
said first part having an increased width larger than a width of a remaining part of said first device region, such that a gate width of said first transfer transistor has an increased width,
said second part having an increased width larger than a width of a remaining part of said second device region, such that a gate width of said second transfer transistor has an increased width.

2. The semiconductor device as claimed in claim 1, wherein said first part of said first device region and said second part of said second device region have respective outer edges such that said outer edges face away from each other on said semiconductor substrate across said device isolation region, said outer edge of said first part being offset in a direction away from said second device region as compared with an outer edge of said remaining part of said first device region, said outer edge of said second part being offset in a direction away from said first device region as compared with an outer edge of said remaining part of said second device region.

3. The semiconductor device as claimed in claim 1, wherein said first part of said first device region and said second part of said second device region have respective inner edges such that said inner edges face with each other on said semiconductor substrate across said device isolation region, said inner edge of said first part extending straight in continuation with an inner edge of said remaining part of said first device region, said inner edge of said second part extending straight in continuation with an inner edge of said remaining part of said second device region.

4. The semiconductor device as claimed in claim 1, wherein said first part of said first device region and said second part of said second device region are bulged in mutually opposing directions on said semiconductor substrate.

5. The semiconductor device as claimed in claim 1, wherein each of said first and second device regions has a U-shaped form.

6. The semiconductor device as claimed in claim 1, wherein said plurality of static random access memory cells forming a predetermined array of contact plugs on said semiconductor substrate.

7. The semiconductor device as claimed in claim 1, wherein said first part of said first device region and said second part of said second device region have respective outer edges such that said outer edges face away from each other on said semiconductor substrate across said device isolation region, said outer edge of said first part being offset in a direction away from said second device region as compared with an outer edge of said remaining part of said first device region, said outer edge of said second part being offset in a direction away from said first device region as compared with an outer edge of said remaining part of said second device region.

8. The semiconductor device as claimed in claim 1, wherein said first part of said first device region and said second part of said second device region have respective inner edges such that said inner edges face with each other on said semiconductor substrate across said device isolation region, said inner edge of said first part extending straight in continuation with an inner edge of said remaining part of said first device region, said inner edge of said second part extending straight in continuation with an inner edge of said remaining part of said second device region.

9. The semiconductor device as claimed in claim 1, wherein said first part of said first device region and said second part of said second device region are bulged in mutually opposing directions on said semiconductor substrate.

10. The semiconductor device as claimed in claim 1, wherein each of said first and second device regions has a U-shaped form.

11. A semiconductor device comprising:
a semiconductor substrate;
a flash memory formed on a device region surrounded by a first device isolation region of a first STI in the semiconductor substrate, the flash memory operates during a writing operation or easing operation at a first voltage; and an SRAM formed on the semiconductor substrate, the SRAM operates at a second voltage lower than the first voltage, the SRAM comprising a plurality of static random access memory cells, each of the plurality of static random access memory cells comprising:
a first transfer transistor, a second transfer transistor, a first p-channel MOS transistor, second p-channel MOS transistor, a first n-channel MOS transistor and second n-channel MOS transistor, the first and second p-channel MOS transistors and the first and second n-channel MOS transistors forming a flip-flop circuit, formed on a device region surrounded by a second device isolation region of a second STI formed in the semiconductor substrate, the second device isolation region of the second STI having a substantially same shape as the first device isolation region of the first STI, each of the first and second transfer transistors formed on the device isolation region surrounded by the second device isolation of the second STI;
the first transfer transistor provided between a first bit line and a first node, the first transfer transistor having a first gate electrode connected to a word line, the first transfer transistor being activated by a selection signal on said word line, the first transfer transistor contacting with a first bit line at a first bit contact region on a first portion of the device region; and the second transfer transistor provided between a second bit line and a second node, the second transfer transistor having a second gate electrode connected to the word line, the second transfer transistor being activated by the selection signal on the word line, the second transfer transistor contacting with a second bit line at a second bit contact region on a second portion of the device region;
wherein a width of the first portion of the device region being larger than a width of the device region of the first node, and
wherein a width of the second portion of the device region being larger than a width of the device region of the second node.

* * * * *